United States Patent [19]

Yamashita et al.

[11] Patent Number: 5,675,168
[45] Date of Patent: Oct. 7, 1997

[54] UNSYMMETRICAL MOS DEVICE HAVING A GATE INSULATOR AREA OFFSET FROM THE SOURCE AND DRAIN AREAS, AND ESD PROTECTION CIRCUIT INCLUDING SUCH A MOS DEVICE

[75] Inventors: Kyoji Yamashita, Osaka; Shinji Odanaka, Hirakata; Kazumi Kurimoto, Kobe; Akira Hiroki, Osaka; Isao Miyanaga, Kawachinagano; Atsushi Hori, Hirakata, all of Japan

[73] Assignee: Matsushita Electric Industrial Co., Ltd., Osaka, Japan

[21] Appl. No.: 415,928

[22] Filed: Apr. 3, 1995

[30] Foreign Application Priority Data

Apr. 1, 1994  [JP]  Japan ................... 6-064973

[51] Int. Cl.⁶ ............................. H01L 23/60; H01L 29/78
[52] U.S. Cl. ................. 257/355; 257/356; 257/344; 257/357; 257/408
[58] Field of Search ................. 257/355, 356, 257/344, 357, 336, 328, 408

[56] References Cited

U.S. PATENT DOCUMENTS

| | | | |
|---|---|---|---|
| 5,162,888 | 11/1992 | Co et al. | 257/357 |
| 5,234,853 | 8/1993 | Ikemasu | 437/44 |
| 5,386,134 | 1/1995 | Huang | 257/356 |
| 5,493,142 | 2/1996 | Randazzo et al. | 257/336 |

FOREIGN PATENT DOCUMENTS

| | | | |
|---|---|---|---|
| 54-44482 | 4/1979 | Japan. | |
| 0064167 | 4/1986 | Japan | 257/356 |
| 5-218070 | 8/1993 | Japan. | |
| 6-188412 | 7/1994 | Japan. | |

OTHER PUBLICATIONS

T. Horiuchi, et al., "A High Performance Asymmetric LDD MOSFET Using Selective Oxide Deposition Techinque", *1992 Symposium on VLSI Technology Digest of Technical Papers*, pp. 88–89 (1992).

*Primary Examiner*—Tom Thomas
*Assistant Examiner*—David B. Hardy
*Attorney, Agent, or Firm*—Ratner & Prestia

[57] ABSTRACT

An unsymmetrical MOS device is disclosed which includes a semiconductor layer of a first conductive type having a surface having a first area and a second area which is offset from the first area; a gate insulator layer located on the first area of the surface of the semiconductor layer; a gate electrode located on the gate insulator layer; and a source region of a second conductive type and a drain region of the second conductive type each located in the semiconductor layer below the second area of the surface. The electric resistance of an area between the first area of the surface and the surface of the source region is smaller than the electric resistance of an area between the first area of the surface and the surface of the drain region.

5 Claims, 9 Drawing Sheets

UNSYMMETRICAL MOS DEVICE HAVING A GATE INSULATOR AREA OFFSET FROM THE SOURCE AND DRAIN AREAS, AND ESD PROTECTION CIRCUIT INCLUDING SUCH A MOS DEVICE

BACKGROUND OF THE INVENTION

1. Field of the Invention:

The present invention relates to an unsymmetrical MOS device, a method for producing the same, and a protection circuit against electrostatic discharge (hereinafter, referred to as "ESD") including such an unsymmetrical MOS device.

2. Description of the Related Art:

Recently, components of VLSIs have been remarkably reduced in size and enhanced in functions. Such developments have increased the number of pins used in VLSIs. Accordingly, in each VLSI chip, the ratio of the area occupied by transistors for protecting the device against ESD (hereinafter, referred to as "ESD protection transistors") with respect to the total area has been enlarged. In order to reduce such a ratio, improvement of the performance of ESD protection transistors is strongly demanded, although increase in the number of production steps need be restricted as much as possible in order to avoid increase in production costs. Under these circumstances, a MOS device having an offset single drain structure has been proposed to be used as an ESD protection transistor.

Briefly referring to FIG. 7, a MOS device 7 including an offset single drain structure will be described. FIG. 7 is a cross sectional view of the MOS device 7. The MOS device 7 includes a p-type semiconductor substrate 700, a gate insulator film 701, a gate electrode 702, gate side wall spacers 703, and n-type high density impurity diffusion regions 704a and 704b respectively acting as a source region and a drain region.

The MOS device 7 has, for example, the following features.

(1) The MOS device 7 does not have an LDD (lightly doped drain) structure. An LDD is an impurity dispersion region which has an impurity density which is lower than that of a normal drain region, and is conventionally provided between a drain region and a channel region and also between a source region and the channel region. In this specification, such an LDD is also referred to as a "low density impurity diffusion region, and normal source and drain regions are also referred to as high density impurity diffusion regions". The structure of the MOS device 7 with no LDD structure is referred to as a "single drain structure". In the MOS device 7 having a single drain structure, the intensity of an electric field of a current path having a maximum current amount and the intensity of an electric field at a p-n junction are lower than those of a MOS device having an LDD structure. As a result, the withstand voltage against ESD per unit gate width is higher in the MOS device 7 having a single drain structure than in a MOS having an LDD structure.

(2) As is illustrated in FIG. 7, the drain region 704b is offset toward right from an area represented by letter A, which is immediately beneath the gate electrode 702. Due to such a structure, which is referred to as an "offset single drain structure", the GIDL (Gate Induced Drain Leakage) current of the MOS device 7 is smaller than that of a MOS device in which a high density impurity diffusion region, namely, a normal drain region extends to an end of area A immediately beneath the gate electrode.

Today, despite the above-described advantages of a single drain structure, MOS devices having an LDD structure are used as ESD protection transistors in LSI chips which are produced for sale using the 0.5 μm and 0.8 μm rule CMOS processes, in addition to be used as transistors in logic circuits.

FIG. 8 is a cross sectional view of a conventional MOS device 8 having an LDD structure (see Japanese Laid-Open Patent Publication No. 54-44482). As is shown in FIG. 8, the MOS device 8 includes a p-type semiconductor substrate 800, a gate insulator film 801, a gate electrode 802, gate side wall spacers 803, an n-type low density impurity diffusion region 804, and two n-type high density impurity diffusion regions 805 respectively acting as a source region and a drain region.

The withstand voltage against ESD per unit gate width of the MOS device 8 having an LDD structure is approximately half of such a withstand voltage of the MOS device 7 having a single drain structure. The MOS device 8 is generally designed to have a maximum possible gate width in order to obtain a sufficient withstand voltage against ESD.

The above-described conventional ESD protection transistors have the following problems.

In the MOS devices having a single drain structure, in the case where the transistor also acts as an I/O circuit, the parasitic resistance of the area between an area immediately beneath the gate electrode (for example, area A in FIG. 7) and the drain region is excessively large. Such a high parasitic effect decreases the driving power.

In the MOS devices having an LDD structure, the withstand voltage against ESD is not sufficiently large as is described above.

In a circuit including a conventional ESD protection circuit and an I/O circuit, the above-described large parasitic effect increases power consumption, and also the large layout area enlarges the chip size.

SUMMARY OF THE INVENTION

According to one aspect of the present invention, an unsymmetrical MOS device includes a semiconductor layer of a first conductive type having a surface having a first area and a second area which is offset from the first area; a gate insulator layer located on the first area of the surface of the semiconductor layer; a gate electrode located on the gate insulator layer; and a source region of a second conductive type and a drain region of the second conductive type each located in the semiconductor layer below the second area of the surface. The electric resistance of an area between the first area of the surface and the surface of the source region is smaller than the electric resistance of an area between the first area of the surface and the surface of the drain region.

Such an unsymmetrical MOS device is produced by a method including the steps of forming the gate insulator layer on the semiconductor layer; forming the gate electrode on the gate insulator layer; covering an area to be formed into the drain region with an implantation stop layer; implanting ions of an impurity of the second conductive type into the semiconductor layer using the implantation stop layer and the gate electrode as a mask; removing the implantation stop layer; forming side wall spacers on two sides of the gate electrode; and implanting ions of an impurity of the second conductive type into the semiconductor layer using the gate electrode and the side wall spacers as a mask, thereby forming the source region and the drain region both of the second conductive type.

According to another aspect of the present invention, an unsymmetrical MOS device includes a semiconductor substrate having a surface and including a first conductive type region and a second conductive type region, the first conductive type region and the second conductive type region adjoining the surface, a part of the surface adjoining the first conductive type region has a first area and a second area which is offset from the first area, and another part of the surface adjoining the second conductive type region has a third area and a fourth area which is offset from the third area; a MOS transistor of a first conductive type located in the second conductive type region; and a MOS transistor of a second conductive type located in the first conductive type region. The MOS transistor of the second conductive type includes a gate insulator layer located on the first area of the surface adjoining the second conductive type region; a gate electrode located on the gate insulator layer; and a source region of the second conductive type and a drain region of the second conductive type, the source region and the drain region being located in the semiconductor substrate below the second area of the surface. The electric resistance of an area between the first area of the surface and the surface of the source region is smaller than the electric resistance of an area between the first area of the surface and the surface of the drain region. The MOS transistor of the first conductive type includes a gate insulator layer located on the third area of the surface adjoining the first conductive type region; a gate electrode located on the gate insulator layer; and a source region of the first conductive type and a drain region of the first conductive type, the source region and the drain region being located in the semiconductor substrate below the fourth area of the surface. The electric resistance of an area between the third area of the surface and the surface of the source region is equal to the electric resistance of an area between the third area of the surface and the surface of the drain region.

Such a MOS device is produced by a method including the steps of forming a first gate insulator layer on the semiconductor substrate in the first conductive region and forming a second gate insulator layer on the semiconductor substrate in the second conductive region; forming a first gate electrode on the first gate insulator layer and forming a second gate electrode on the second gate insulator layer; covering an area of the first conductive region to be formed into a drain region of the MOS transistor of the second conductive type and the second conductive region with a first implantation stop layer; implanting ions of an impurity of the second conductive type into the first conductive type region using the first implantation stop layer and the first gate electrode as a mask; removing the first implantation stop layer; covering the first conductive type region with a second implantation stop layer; implanting ions of an impurity of the first conductive type into the second conductive type region using the second implantation stop layer and the second gate electrode as a mask; removing the second implantation stop layer; forming side wall spacers on two sides of each of the first and second gate electrodes; covering the second conductive type region with a third implantation stop layer; implanting ions of an impurity of the second conductive type into the first conductive type region using the third implantation stop layer and the first gate electrode as a mask, thereby forming a source region and the drain region of the MOS transistor of the second conductive type; removing the third implantation stop layer; covering the first conductive type region with a fourth implantation stop layer; and implanting ions of an impurity of the first conductive type into the second conductive type region using the fourth implantation stop layer and the second gate electrode as a mask, thereby forming a source region and a drain region of the MOS transistor of the first conductive type.

According to still another aspect of the present invention, an ESD protection circuit includes an I/O pad for sending in and out an electric signal; a terminal for supplying a prescribed potential; a first NchMOSFET having a drain connected to the I/O pad and a source and a gate both connected to the terminal; and a second NchMOSFET having a drain connected to the I/O pad and a source and a gate both connected to the terminal. The first NchMOSFET and the second NchMOSFET each include a semiconductor layer of a p-type having a surface having a first area and a second area which is offset from the first area; a gate insulator layer located on the first area of the surface of the semiconductor layer; a gate electrode located on the gate insulator layer; and a source region of n-type and a drain region of an n-type each located in the semiconductor layer below the second area of the surface. The second NchMOSFET includes an impurity diffusion region of an n-type between an area immediately beneath the first area of the surface and the source region, and the electric resistance of an area between the first area of the surface and the surface of the source region is smaller than the electric resistance of an area between the first area of the surface and the surface of the drain region in the second NchMOSFET.

Thus, the invention described herein makes possible the advantages of providing a MOS device having a higher withstand voltage against ESD, a smaller GIDL current, and a larger driving power, a method for producing such a MOS device, and an ESD protection circuit including such a MOS device.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
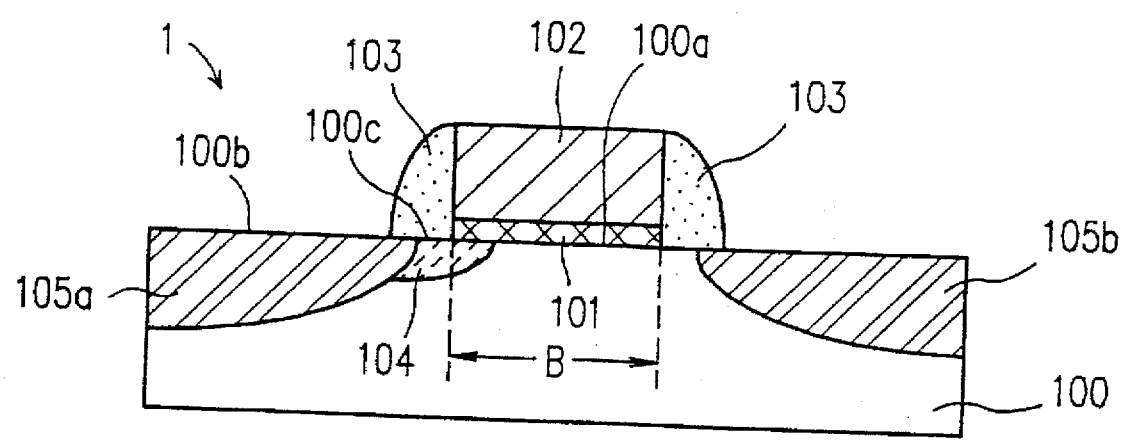
FIG. 1 is a cross sectional view of a MOS device in a first example according to the present invention.

With reference to FIG. 1, an unsymmetrical MOS device 1 in a first example according to the present invention will be described. FIG. 1 is a cross sectional view of the unsymmetrical MOS device 1. The unsymmetrical MOS device 1 includes a p-type substrate 100 formed of a single crystalline silicon, a gate insulator film 101 located on the top surface of the p-type substrate 100, a gate electrode 102 located on the gate insulator film 101, side wall spacers 103 located on two side surfaces of the gate electrode 102, an n-type source region 105a provided in the substrate 100, and an n-type drain region 105b also provided in the substrate 100.

In this specification, the top surface of the substrate 100 will be considered as divided into three types of areas for simplicity: a first area 100a below the gate electrode 102, a second area 100b which is offset outward with respect to the first area 100a by 0.05 to 0.10 μm, and an intermediate area 100c which is between the first area 100a and the second area 100b. The gate insulator film 101 and the gate electrode 102 are on the first area 100a. The source region 105a and the drain region 105b are both on the respective second areas 100b. The side wall spacers 103 are on the respective intermediate areas 100c.

The unsymmetrical MOS device 1 further includes an n-type impurity, diffusion region 104 located between an area represented by letter B immediately beneath the first area 100a and the source region 105a. More accurately, the n-type impurity diffusion region 104 adjoining the source region 105a extends into area B immediately beneath the first area 100a. Thus, the unsymmetrical MOS device 1 has an LDD structure on the source side and an offset single drain structure on the drain side. The n-type impurity diffusion region 104 has an impurity density of $2 \times 10^{17}$ cm$^{-3}$, which is lower than the impurity density ($2 \times 10^{20}$ cm$^{-3}$) of the source region 105a. The thickness (0.14 μm) of the n-type impurity diffusion region 104 is less than the maximum thickness (0.20 μm) of the source region 105a. Due to the n-type impurity diffusion region 104, the electric resistance of the intermediate area 100c between the first area 100a and the top surface of the source region 105a is smaller than the electric resistance of the intermediate area 100c between the first area 100a and the top surface of the drain region 105b.

The unsymmetrical MOS device 1 shown in FIG. 1 is a MOSFET including the substrate 100 formed of a single crystal silicon. The substrate 100 may also be formed of an insulation plate having a single crystalline semiconductor layer, a polycrystalline semiconductor layer or an amorphous semiconductor layer thereon.

With reference to FIGS. 3A–3E, a method for producing the unsymmetrical MOS device 1 will be described.

Figure 3A:
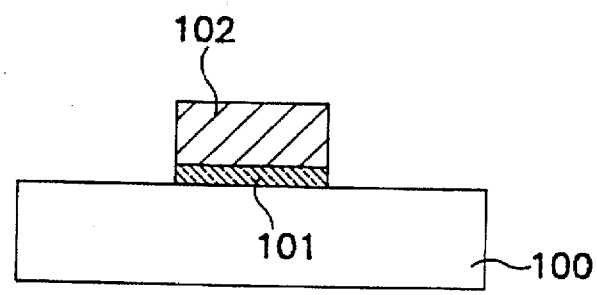
FIGS. 3A–3E are a schematic illustration of a method for producing the MOS device shown in FIG. 1.

As is shown in FIG. 3A, the gate insulator film 101 and the gate electrode 102 are provided by forming an oxide film having a thickness of approximately 10 nm and a conductive film having a thickness of approximately 200 nm consecutively on the p-type substrate 100 and etching the oxide film and the conductive film into a prescribed pattern. Etching is performed by dry etching with strong anisotropy in the direction perpendicular to the top surface of the substrate 100. Although the top surface of the substrate 100 is exposed in FIG. 3A, the oxide film which is used for forming the gate insulator film 101 may remain thereon.

Figure 3B:
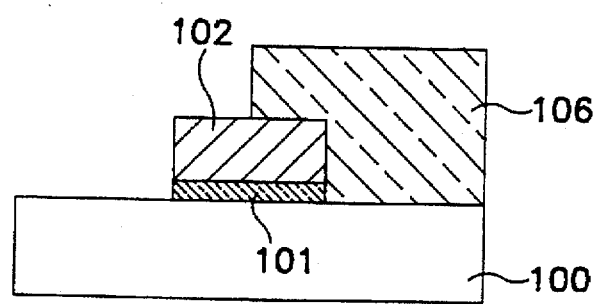

As is shown in FIG. 3B, the resultant lamination is covered with the photoresist 106, and the photoresist 106 is patterned so as to cover a part of the lamination on the side of the drain region 105b, which will be formed later.

Figure 3C:
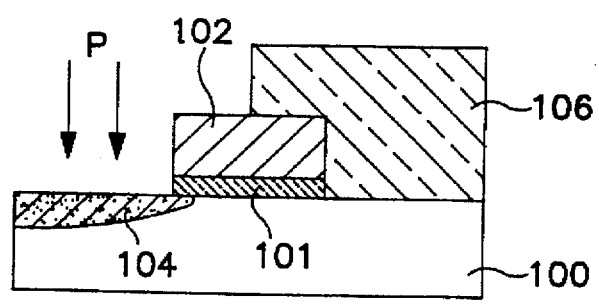

As is shown in FIG. 3C, an n-type impurity, for example, phosphorus ions are implanted into the substrate 100 at an implanting energy of approximately 40 KeV and a dose of approximately $4 \times 10^{13}$ cm$^{-2}$ at an angle of approximately 7 degrees, using the photoresist 106 and the gate electrode 102 as a mask, thereby forming the n-type impurity diffusion region 104.

Figure 3D:
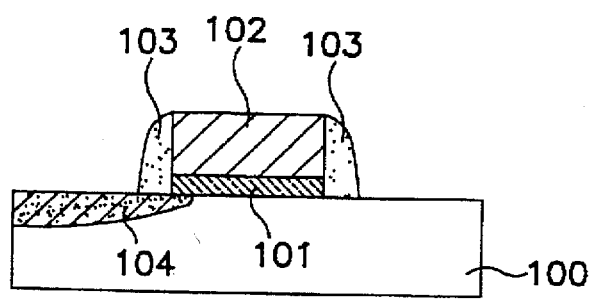

As is shown in FIG. 3D, after the photoresist 106 is removed, the side wall spacers 103 are formed by depositing an insulator film, for example, an oxide film on the substrate 100 at a thickness of approximately 150 nm and etching the insulator film into a prescribed pattern. Etching is performed by dry etching with strong anisotropy in the direction perpendicular to the top surface of the substrate 100.

Figure 3E:
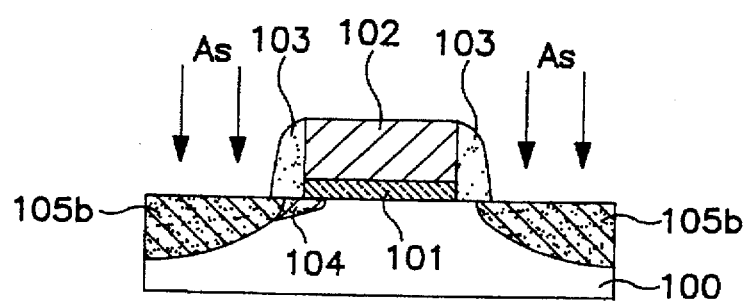

As is shown in FIG. 3E, an n-type impurity, for example, arsenide ions are implanted into the substrate 100 at an implanting energy of approximately 80 KeV and a dose of approximately $6 \times 10^{15}$ cm$^{-2}$, thereby forming the n-type impurity diffusion regions 105a and 105b each having an impurity density which is higher than that of the n-type impurity region 104. The regions 105a and 105b respectively act as the source region and the drain region. In this way, the unsymmetrical MOS transistor 1 having an LDD structure on the source side and an offset single drain structure on the drain side is produced easily without increasing the number of production steps or using a special process.

The unsymmetrical MOS device 1 having a structure shown in FIG. 1 and a conventional symmetrical MOS device having a LDD structure both on the source side and the drain side can be produced on one substrate by simply eliminating formation of an LDD, namely, a low density impurity diffusion region in a portion which will be formed into the MOS device 1. This is advantageous for producing a semiconductor device including a plurality of MOS devices on one substrate.

Figure 7:
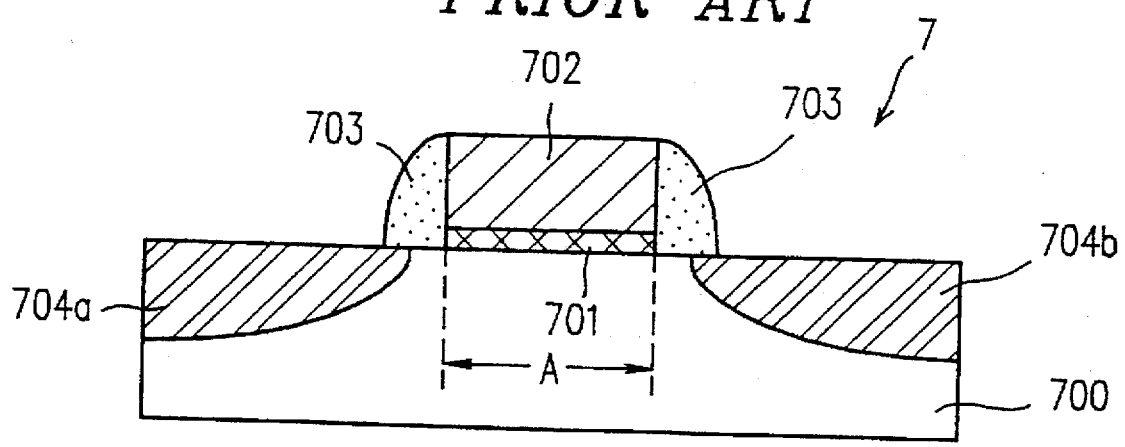
FIG. 7 is a cross sectional view of a conventional MOS device.
Figure 8:
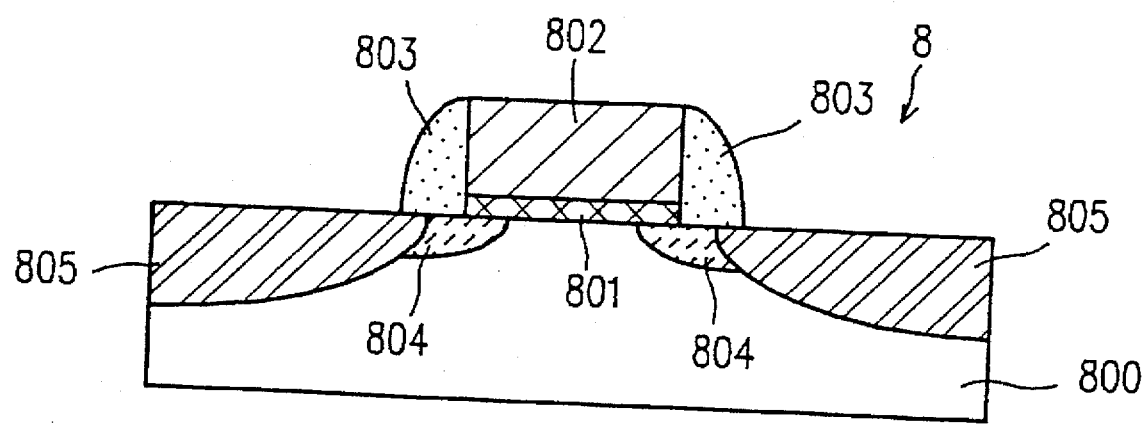
FIG. 8 is a cross sectional view of another conventional MOS device.

Characteristics of the MOS device 1 in the first example according to the present invention and the conventional MOS devices shown in FIGS. 7 and 8 were compared. The MOS devices used for the comparison were as follows:

Conventional NchMOSFET 1 (FIG. 8): The source side and the drain side both have an LDD structure.

Conventional NchMOSFET 2 (FIG. 7): The source side and the drain side both have an offset single drain structure.

NchMOSFET of example 1 (FIG. 1): The source side has an LDD structure and the drain side has an offset single drain structure.

The driving power of the NchMOSFET in the first example according to the present invention and the driving power of the conventional NchMOSFETs 1 and 2 were compared using process - device simulation.

Figure 9:
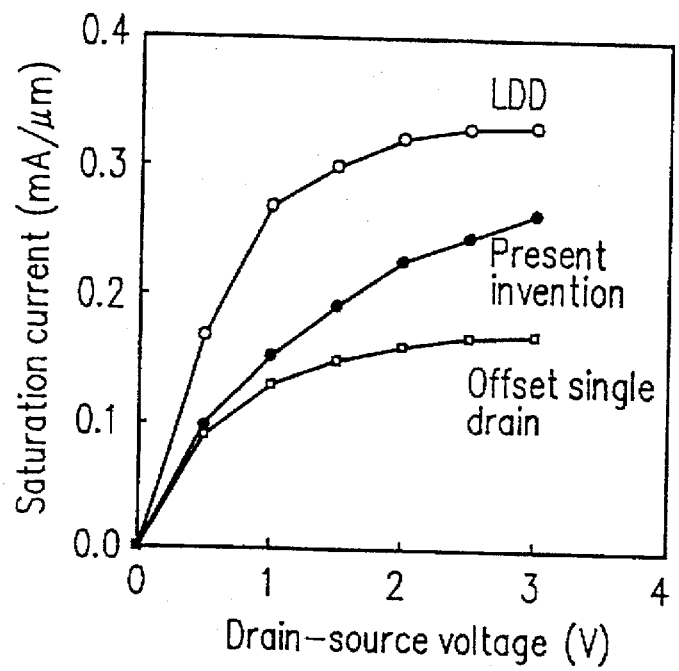
FIG. 9 is a graph illustrating the saturation current as a function of the drain voltage of a MOS device according to the present invention and the conventional MOS devices.

FIG. 9 is a graph illustrating the saturation current of the drain by a function of the drain voltage. The process simulation was performed Under the conditions that the gate voltage was 3 V, the gate length was 0.5 μm, and the thickness of the gate insulator film was 10 nm.

As is appreciated from FIG. 9, the saturation current Idsat per unit Gate width obtained when the gate voltage and the drain voltage were both 3 V was:

Conventional NchMOSFET 1 (FIG. 8): 0.329 mA/μm
Conventional NchMOSFET 2 (FIG. 7): 0.168 mA/μm
NchMOSFET of example 1 (FIG. 1): 0.259 mA/μm The driving power of the MOSFET in the first example is lower than that of conventional MOSFET 1 by approximately 21% but is higher than that of conventional MOSFET 2 by approximately 54%.

Figure 10:
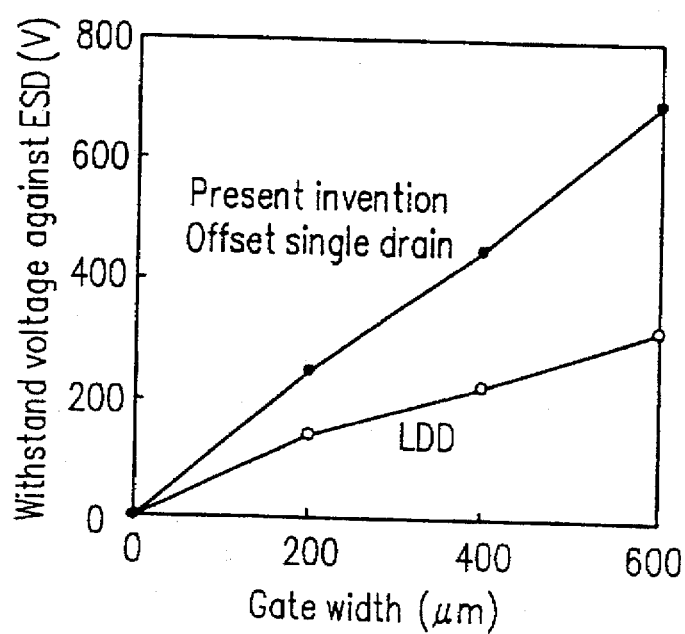
FIG. 10 is a graph illustrating the dependency of the Withstand voltage against ESD on the gate width of a MOS device according to the present invention and the conventional MOS devices.

FIG. 10 is a graph illustrating the dependency of the withstand voltage against ESD on the gate width of the above-mentioned MOSFETs obtained by a 200 pF surge test. Since the withstand voltage against ESD is determined only by the structure of the drain side of the MOSFET, conventional MOSFET 2 and the MOSFET in the first example presented the same results.

As is appreciated from FIG. 10, the withstand voltage against ESD is in proportion to the gate width, and each withstand voltage of conventional MOSFET 2 and the MOSFET in the first example is twice or more of that of conventional MOSFET 1.

The withstand voltage against ESD per unit gate width obtained from FIG. 10 was:

Conventional NchMOSFET 1 (FIG. 8): 0.53 V/μm

Conventional NchMOSFET 2 (FIG. 7): 1.14 V/μm

NchMOSFET in example 1 (FIG. 1): 1.14 V/μm

From these results, the driving power of the MOSFET in the first example is lower than that of conventional MOSFET 1 by approximately 21%, but the withstand voltage against ESD of the former is twice or more of that of the latter. The withstand voltage against ESD of the MOSFET in the first example is equal to that of conventional MOSFET 2, but the driving power of the former is higher than that of the latter by approximately 54%. The MOSFET in the first example is optimum as an ESD protection transistor also acting as an I/O circuit. This will be described later with reference to FIGS. 5 and 6.

EXAMPLE 2

Figure 2:
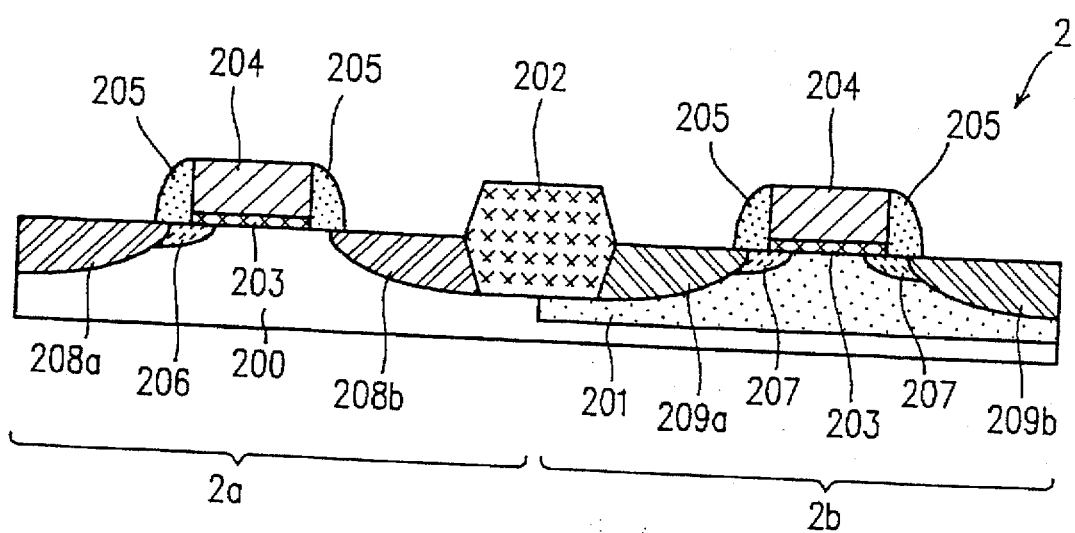
FIG. 2 is a cross sectional view of a MOS device in a second example according to the present invention.

With reference to FIG. 2, a CMOS device 2 in a second example according to the present invention will be described. FIG. 2 is a cross sectional view of the CMOS device 2 including an n-channel MOS device 2a and a p-channel MOS device 2b.

The CMOS device 2 includes a p-type substrate 200 formed of a semiconductor material, an n-type well 201 provided in the substrate 200, a LOCOS 202 for isolating the n-channel MOS device 2a from the p-channel MOS device 2b, two gate insulator films 203 respectively located on a top surface of the substrate 200 and a top surface of the n-type well 201, gate electrodes 204 located on the gate insulator films 203, an n-type low density impurity diffusion region 206 provided in the substrate 200, n-type high density impurity diffusion regions 208a and 208b respectively acting as a source region and a drain region provided in the substrate 200, p-type low density impurity diffusion regions 207 located in the n-type well 201, p-type high density impurity diffusion regions 209a and 209b respectively acting as a source region and a drain region provided in the n-type well 201, and gate side wall spacers 205 located on two side surfaces of each gate electrode 204.

In FIG. 2, the MOS device on the left is the n-channel MOS device 2a and the MOS device on the right is the p-channel MOS device 2b. The n-channel MOS device 2a has an unsymmetrical structure with the n-type low density impurity dispersion region 206, namely, an LDD only on the source side. Whereas, the p-channel MOS device 2b has a symmetrical structure with the p-type low density impurity dispersion regions 207, namely, LDDs both on the source side and the drain side. The CMOS device 2 having these two different types of MOS devices side by side has a larger driving power than and an equal withstand voltage to those of a CMOS device having two unsymmetrical MOS devices. Moreover, production of the CMOS device 2 requires one less mask than production of a CMOS device having two unsymmetrical MOS devices.

The reason why the withstand voltage against ESD of the CMOS device 2 is equal to that of a CMOS device having two unsymmetrical MOS devices despite the symmetrical structure of the p-channel MOS device 2b is as follows:

Since the channel resistance of the p-channel MOS device 2b is higher than that of the n-channel MOS device 2a, the current flows more easily in the n-channel MOS device 2a than in the p-channel MOS device 2b during protection operation against ESD. Accordingly, even though the withstand voltage against ESD of the p-channel MOS device 2b is lower than that of the n-channel MOS device 2a, ESD does not occur in the p-channel MOS device 2b as easily as in the n-channel MOS device 2a. Thus, the withstand voltage against ESD of the CMOS device 2 is determined by the structure of the n-channel MOS device 2a.

With reference to FIGS. 4A–14E, a method for producing the CMOS device 2 will be described.

Figure 4A:
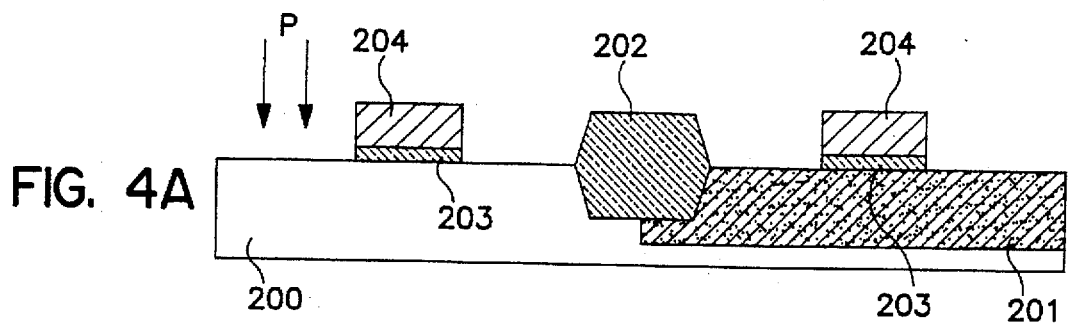
FIGS. 4A–4E are a schematic illustration of a method for producing the MOS device shown in FIG. 2.

As is illustrated in FIG. 4A, the gate insulator films 203 and the gate electrodes 204 are provided by forming an oxide film and a conductive film consecutively on the top surface of the substrate 200 and the top surface of the n-type well 201 at a thickness of approximately 10 nm and a thickness of approximately 200 nm respectively and etching the oxide film and the conductive film into a prescribed pattern. Etching is performed by dry etching with strong anisotropy in the direction perpendicular to the top surface of the substrate 200 and the n-type well 201.

Figure 4B:
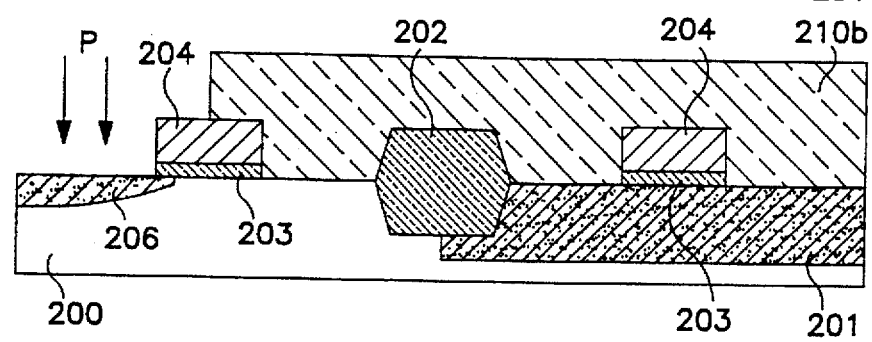

As is illustrated in FIG. 4B, a photoresist 210b is applied to the resultant lamination and is patterned so as to expose a part of the substrate 200 and a part of the lamination formed directly on the substrate 200 on the source side. An n-type impurity, for example, phosphorus ions are implanted into the substrate 200 at an implanting energy of approximately 40 KeV and a dose of approximately $4 \times 10^{13}$ cm$^{-2}$ at an angle of approximately 7 degrees, using the gate electrode 204 on the left and the photoresist 210b as a mask, thereby forming the n-type low density impurity dispersion region 206.

Figure 4C:
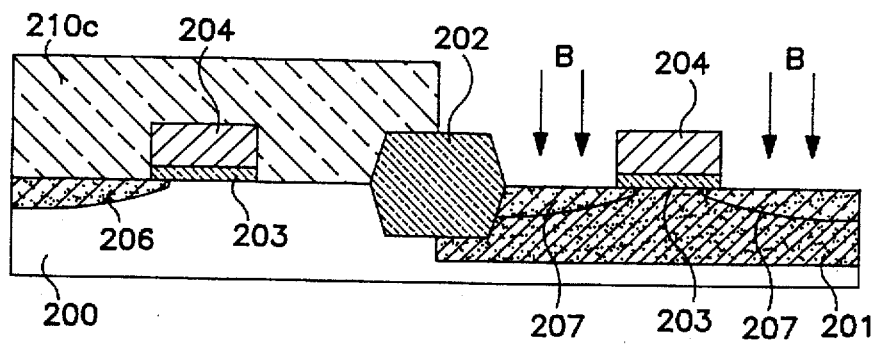

As is illustrated in FIG. 4C, after the photoresist 210b is removed, a photoresist 210c is applied to the resultant lamination and is patterned so as to cover the entire top surface of the substrate 200 and the lamination thereon. A p-type impurity, for example, $BF_2$ ions are implanted into the n-type well 201 at an implanting energy of approximately 40 KeV and a dose of approximately $4 \times 10^{13}$ cm$^{-2}$ at an angle of approximately 7 degrees, using the gate electrode 204 on the right and the photoresist 210c as a mask, thereby forming the p-type low density impurity diffusion regions 207.

Figure 4D:
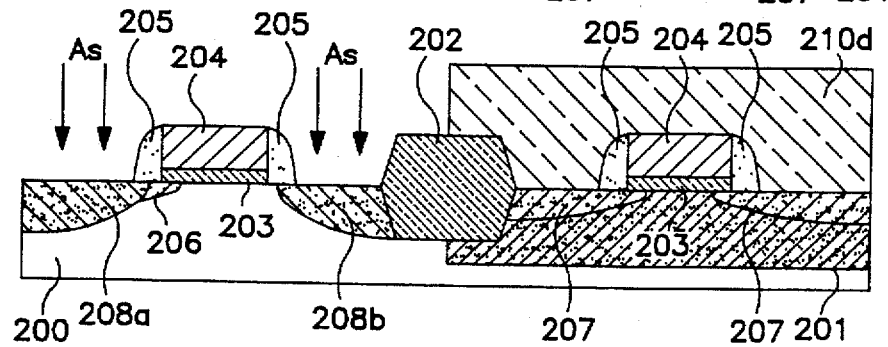

As is illustrated in FIG. 4D, after the photoresist 210c is removed, the gate side wall spacers 205 are formed by depositing an insulator film, for example, an oxide film on the resulting lamination at a thickness of approximately 150 nm and etching the oxide film by dry etching with strong anisotropy in the direction perpendicular to the top surface of the substrate 200 and the n-type well 201. Then, a photoresist 210d is applied to the resultant lamination and is patterned so as to cover the entire top surface of the n-type well 201 and the lamination thereon. An n-type impurity, for example, arsenide ions are implanted into the substrate 200 at an implanting energy of approximately 80 KeV and a dose of approximately $6 \times 10^{15}$ cm$^{-2}$ at an angle of approximately 7 degrees, using the gate electrode 204 on the left and the photoresist 210d as a mask, thereby forming the n-type high density impurity diffusion regions 208a and 208b respectively acting as the source region and the drain region.

Figure 4E:
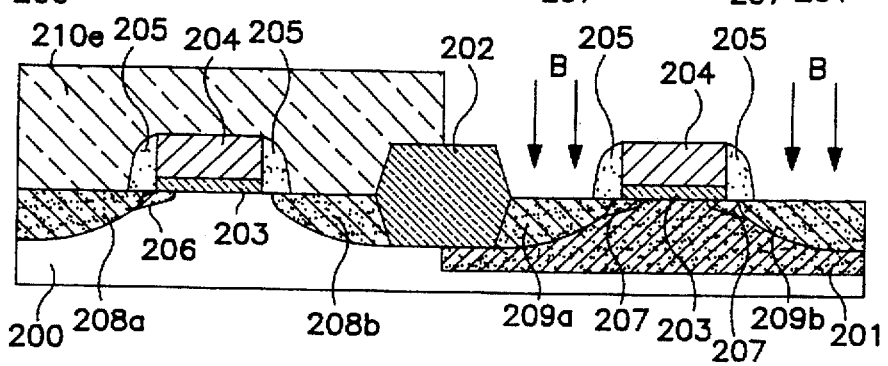

As is illustrated in FIG. 4E, after the photoresist 210d is removed, a photoresist 210e is applied to the resultant lamination and is patterned so as to cover the entire top surface of the substrate 200 and the lamination thereon. A p-type impurity, for example, $BF_2$ ions are implanted into the n-type well 201 at an implanting energy of approximately 80 KeV and a dose of approximately $6 \times 10^{15}$ cm$^{-2}$ at an angle of approximately 7 degrees, using the gate electrode 204 on the right and the photoresist 210e as a mask, thereby forming the p-type high density impurity diffusion regions 209a and 209b respectively acting as the source region and the drain region.

In the above-described method, one photoresist is used both as the photoresist 210c for forming the low density impurity diffusion region 206 in FIG. 4C and the photoresist 210e for producing the high density impurity diffusion regions 209a and 209b in FIG. 4E. Thus, the number of the masks required for production can be reduced by one compared with the case where different photoresists are used for these two steps, for example, where two unsymmetrical MOS devices are produced side by side.

EXAMPLE 3

Figure 5:
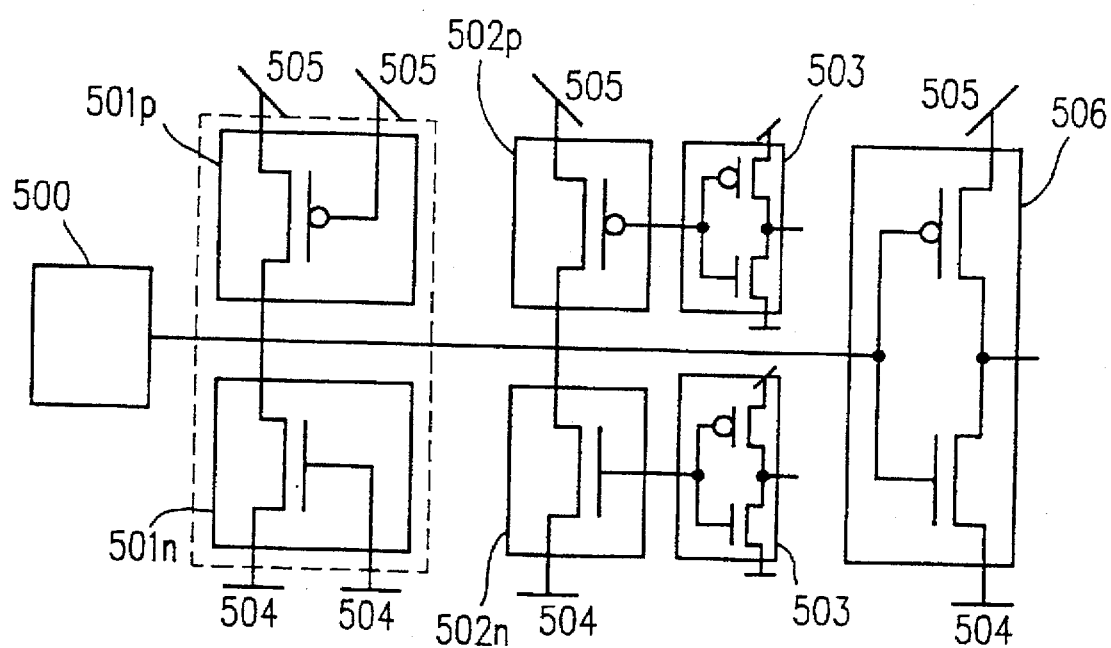
FIG. 5 is a circuit diagram of an ESD protection circuit in a third example according to the present invention.

With reference to FIG. 5, an ESD protection circuit in a third example according to the present invention will be described. FIG. 5 is a circuit diagram of an I/O circuit located between an internal circuit (not shown) and an external device. An I/O pad 500 for sending in and out signals is electrically connected to the internal circuit through an I/O gate 506.

To a wire connecting the I/O gate 506 and the I/O pad 500, a first NchMOSFET 501n, a first PchMOSFET 501p, a second NchMOSFET 502n, and second PchMOSFET 502p are connected through the respective drains thereof.

The source and the gate of the first NchMOSFET 501n are respectively connected to grounding terminals 504, and the source and the gate of the first PchMOSFET 501p are respectively connected to power source terminals 505. The power source terminals 505 are supplied with a potential of, for example, 500 V.

The first PchMOSFET 501p and a first NchMOSFET 501n act as an ESD protection transistor together.

The source of the second NchMOSFET 502n is connected to a grounding terminal 504, and the source of the second PchMOSFET 502p is connected to a power source terminal 505. The Gate of the second NchMOSFET 502n and the gate of the second PchMOSFET 502p are respectively connected to driving circuits 503 of the I/O circuit. By the driving circuit 503, an output signal is sent to the I/O pad 500. In other words, the second PchMOSFET 502p and the second NchMOSFET 502n act together as an I/O circuit also acting as an ESD protection transistor.

The first NchMOSFET 501n, the first PchMOSFET 501p, the second NchMOSFET 502n, and the second PchMOSFET 502p each have a structure shown in FIG. 1. Namely, these four MOSFETs each have an offset single drain structure on the drain side and an LDD structure on the source side thereof.

The circuit shown in FIG. 5 has a high withstand voltage against ESD and a small GIDL current due to the offset single drain structure on the drain side of the first NchMOSFET 501n and the first PchMOSFET 501p. The circuit also has a large driving power because the second NchMOSFET 502n and the second PchMOSFET 502p each have an offset single drain structure on the drain side and an LDD structure on the source side.

A circuit using the MOSFETs in the first example according to the present invention and circuits using conventional MOSFETs having the structure shown in FIGS. 7 and 8 were compared with one another regarding the layout area and the delay time for driving the I/O circuit. Each of the circuits includes a NchMOSFET and a PchMOSFET of the respective structure. All the circuits have the same type of transistors as the protection transistor and the output transistor. Again, the three types of MOSFETs have the following structures.

Conventional MOSFET 1: LDD structure on the source side and the drain side.

Conventional MOSFET 2: Offset- single drain structure on the source side and the drain side.

MOSFET in example 1: Offset single drain structure on the drain side and LDD structure on the source side.

The saturation current Idsat per unit gate width of these MOSFETs obtained by simulation when the gate voltage and the drain voltage were both 3 V was:

Conventional MOSFET 1 (N/Pch): 0.329/0.125 mA/μm (FIG. 8)

Conventional MOSFET 2 (N/Pch): 0.168/0.064 mA/μm (FIG. 7)

MOSFET of example 1 (N/Pch): 0.259/0.098 mA/μm (FIG. 1)

The withstand voltage against ESD of the above mentioned MOSFETs obtained by a 200 pF surge test was:

Conventional MOSFET 1 (FIG. 8): 0.53 V/μm

Conventional MOSFET 2 (FIG. 7): 1.14 V/μm

MOSFET of example 1 (FIG. 1): 1.14 V/μm

In a chip including conventional MOSFETs 1 produced by a standard 0.5 μm CMOS process (hereinafter, referred to as "chip 1"), the layout areas of the protection transistor and the output transistor are as follows:

Protection transistor: 35,200 μm$^2$

Output transistor: 9,072 μm$^2$

The total of these areas is 35,200+9,079=44,9.79. μm$^2$. This is an area necessary for one pad.

In a chip including MOSFETs in the first example (namely, a chip including the circuit in the third example; hereinafter referred to as "chip 3"), the following areas are required in order to obtain the same withstand voltage against ESD and the same driving power as those of chip 1:

Protection transistor: 8,960 μm$^2$

Output transistor: 11,616 pm$^2$

Total: 20,576 μm$^2$

The total area required for one pad is smaller than that of chip 1 by approximately 53%.

In a chip including conventional MOSFETs 2 (hereinafter, referred to as "chip 2"), the following areas are required in order to obtain the same withstand voltage against ESD and the same driving power as those of the chip 1:

Protection transistor: 2,816 μm$^2$

Output transistor: 17,776 μm$^2$

Total: 20,592 μm$^2$

The total area required for one pad is approximately equal to that of chip 3. Accordingly, the junction capacitance is approximately the same in chip 3 and chip 2. Thus, the delay time for input is almost the same in chip 3 and chip 2.

The gate width of the I/O circuit of chip 3 is approximately 56% of that of chip 2. Due to such reduction in the gate width, the gate capacitance of chip 3 is lower than that of chip 2 by approximately 44%, and the RC delay time caused by the gate electrode of chip 3 is shorter than that of chip 2 by approximately 68%. As is appreciated from these results, the delay time for output can be significantly reduced in chip 3 including the circuit in the third example according to the present invention compared with chip 2.

In chip 3 having the circuit in the third example, the gate length of the ESD protection transistor is longer than that of conventional chips 1 and 2. Accordingly, formation of a pattern crossing the gate, which is conventionally difficult in production of unsymmetrical MOSFETs, is easier in chip In the third example, the first NchMOSFET 501n, the first PchMOSFET 501p, the second NchMOSFET 502n, and the second PchMOSFET 502p all have an unsymmetrical structure shown in FIG. 1 as is described above. At least one of the first NchMOSFET 501n and the first PchMOSFET 501p may have an offset single drain structure both on the source side and the drain side. The reason is that the NchMOSFET 501n and the first PchMOSFET 501p, which need to act only as an ESD protection circuit together, need not have a driving power as high as the driving power of the second NchMOSFET 502n and the second PchMOSFET 502p.

EXAMPLE 4

Figure 6:
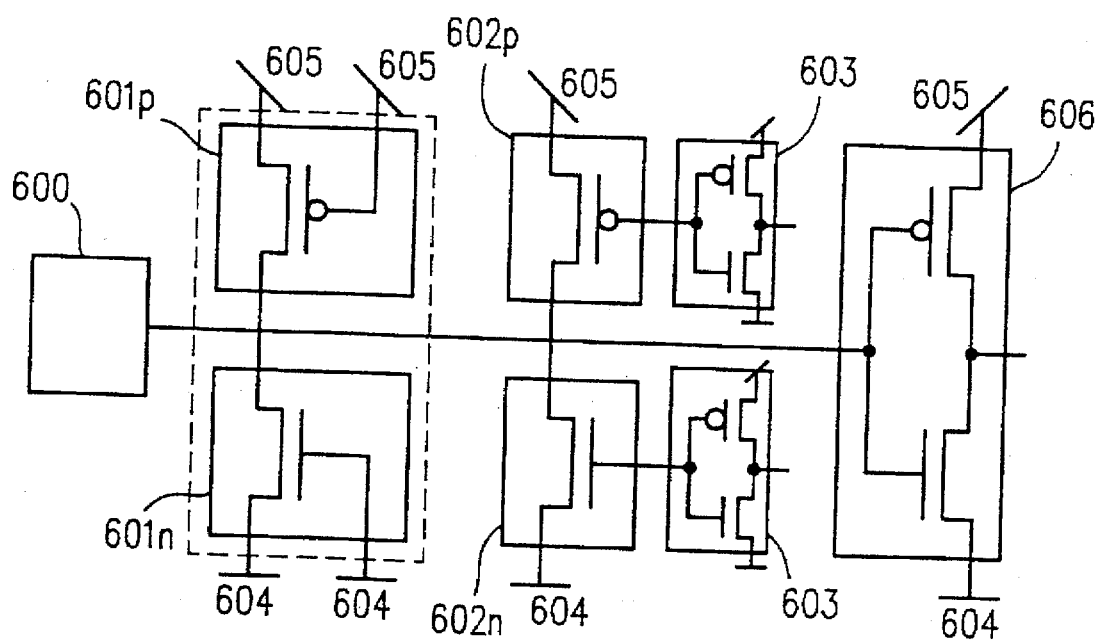
FIG. 6 is a circuit diagram of an ESD protection circuit in a fourth example according to the present invention.

With reference to FIG. 6, an ESD protection circuit in a fourth example according to the present invention will be described. FIG. 6 is a circuit diagram of an I/O circuit located between an internal circuit (not shown) and an external device. An I/O pad 600 for sending in and out signals is electrically connected to the internal circuit through an I/O gate 606.

To a wire connecting the I/O gate 606 and the I/O pad 600, a first NchMOSFET 601n, a first PchMOSFET 601p, a second NchMOSFET 602n, and second PchMOSFET 602p are connected through the respective drains thereof.

The source and the gate of the first NchMOSFET 601n are respectively connected to grounding terminals 604, and the source and the gate of the first PchMOSFET 601p are respectively connected to power source terminals 605.

The first PchMOSFET 601p and a first NchMOSFET 601n act together as an ESD protection transistor.

The source of the second NchMOSFET 602n is connected to a grounding terminal 604, and the source of the second PchMOSFET 602p is connected to a power source terminal 605. The gate of the second NchMOSFET 602n and the gate of the second PchMOSFET 602p are respectively connected to driving circuits 603 of the I/O circuit. By the driving circuit 603, an output signal is sent to the I/O pad 600. In other words, the second PchMOSFET 602p and the second NchMOSFET 602n act together as an I/O circuit also acting as an ESD protection transistor.

The first NchMOSFET 601n and the second NchMOSFET 602n each have an LDD structure on the source side and an offset single drain structure on the drain side thereof. Whereas, the first PchMOSFET 601p and the second PchMOSFET 602p each have an LDD structure both of the source side and the drain side thereof.

The second NchMOSFET 602n and the second PchMOSFET 602p are structured as described above for the following reason.

A PchMOSFET has a relatively high channel resistance and thus does not allow a current to flow therein as easily as an NchMOSFET. Therefore, the possibility of occurrence of an ESD in the PchMOSFET of a CMOSFET is very low even if the withstand voltage against ESD of the PchMOSFET is lower than that of the NchMOSFET of the CMOSFET.

Because of the symmetrical structure of the first PchMOSFET 601p and the second PchMOSFET 602p, the circuit shown in FIG. 6 can be produced by using only one more mask compared with a circuit including the conventional MOSFETs.

In the fourth example, the first NchMOSFET 601n and the second NchMOSFET 602p have an unsymmetrical structure shown in FIG. 1 as is described above. The first NchMOSFET 601n may have an offset single drain structure both on the source side and the drain side. The reason is that the NchMOSFET 601n, which needs to act only as an ESD protection circuit, needs not have a driving power as high as the driving power of the second NchMOSFET 602n.

According to the present invention, the following effects are achieved.

First, a MOS device according to the present invention has, for example, the following effects.

(1) Due to a single drain structure of the drain side, the intensity of an electric field of a current path having a maximum current amount and the intensity of an electric field at a p-n junction between the impurity diffusion region and the semiconductor substrate is lower than those of a MOS device having an LDD structure both on the source side and the drain side. Accordingly, the withstand voltage against ESD of the MOS according to the present invention is higher than such a conventional MOS device.

(2) Due to an offset single drain structure of the drain side, the GIDL current is lower than that of a MOS device in which a high density impurity diffusion region extends into an end of an area immediately beneath the gate electrode.

(3) Due to the LDD structure of the source side, the driving power is higher than a MOS device having an offset single drain structure both on the source side and the drain side.

In a method for producing a MOS device according to the present invention, formation of an LDD is performed using a separate mask instead of using the same mask for forming an LDD and the source and drain regions as is conventionally done. Thus, the above-described MOS device having an unsymmetrical structure can be produced simply by eliminating formation of an LDD while MOS devices having a conventional symmetrical structure are also produced on the same substrate. In this manner, a MOS device having an offset single drain structure on the drain side and an LDD structure on the source side which is suitable for a MOSFET to be used as an ESD protection transistor also acting as an I/O circuit can be produced without increasing production steps or using a special process. Moreover, such a MOS device can be produced with the same number of masks as is required for production of an ESD protection transistor having an offset single drain structure both on the source side and the drain side.

Further, a CMOS device including an NchMOSFET having an unsymmetrical structure and a PchMOSFET having a symmetrical structure can be produced using one less mask compared to a CMOS device having an unsymmetrical structure for both the NchMOSFET and the PchMOSFET. The reason is that the same mask is used for producing the LDD and for producing the source and drain regions in the PchMOSFET.

A circuit including an ESD protection circuit and an I/O circuit both using a MOS device according to the present invention has, for example, the following effects.

(1) Compared to a circuit including an ESD protection circuit and an I/O circuit both having a symmetrical LDD structure, the circuit according to the present invention has a slightly lower driving power and thus requires a slightly larger area for the I/O circuit. However, in the circuit according to the present invention, since the withstand voltage against ESD is larger, the area required for the ESD protection circuit is smaller. As a result, an overall layout area for the chip can be reduced according to the present invention. Compared to a circuit including an ESD protection circuit and an I/O circuit both having a symmetrical offset single drain structure, the I/O circuit of the circuit according to the present invention has a higher driving power. Such a higher driving power allows the gate width to be reduced, and thus the layout area for the I/O circuit can also be reduced.

(2) The gate length of the ESD protection transistor is larger in the circuit according to the present invention than in the conventional circuit. Accordingly, formation of a pattern crossing the gate, which is conventionally difficult in production of an unsymmetrical MOSFET, is easier.

(3) Because of (1), the gate width can be reduced significantly. Accordingly, junction capacitance, namely, the load capacitance for input and the parasitic effect caused by the gate electrode can be reduced significantly. As a result, the delay time for driving the I/O circuit is shortened.

Further, a CMOS device including an NchMOSFET and a PchMOSFET which act both as an ESD protection transistor and an I/O circuit can be produced with one less mask while without reducing the withstand voltage against ESD, by using an unsymmetrical structure for the NchMOSFET and a symmetrical LDD structure for the PchMOSFET compared to a CMOS device in which both the NchMOSFET and the PchMOSFET have an unsymmetrical structure.

Accordingly, a MOS device according to the present invention realizes high integration of ICs, has a higher withstand voltage against ESD, and enjoys high speed operation and low power consumption.

Such a MOS device is easily produced by a method according to the present invention. The method according to the present invention has a high industrial value.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An ESD protection circuit, comprising:

an I/O pad for sending in and out an electric signal;

a terminal for supplying a prescribed potential;

a first NchMOSFET having a drain connected to the I/O pad and a source and a gate both connected to the terminal; and a second NchMOSFET having a drain connected to the I/O pad and a source and a gate both connected to the terminal, wherein the first NchMOSFET and the second NchMOSFET each include:

a semiconductor layer of a p-type having a surface having a first area and a second area which is offset from the first area;

a gate insulator layer located on the first area of the surface of the semiconductor layer;

a gate electrode located on the gate insulator layer; and a source region of an n-type and a drain region of an n-type each located in the semiconductor layer below the second area of the surface, wherein the second NchMOSFET includes an impurity diffusion region of an n-type between an area immediately beneath the first area of the surface and the source region, and the electric resistance of an area between the first area of the surface and the surface of the source region is smaller than the electric resistance of an area between the first area of the surface and the surface of the drain region in the second NchMOSFET.

2. An ESD protection circuit according to claim 1, wherein the first NchMOSFET includes an impurity diffusion region of an n-type between an area immediately beneath the first area of the surface and the source region, and the electric resistance of an area between the first area of the surface and the surface of the source region is smaller than the electric resistance of an area between the first area of the surface and the surface of the drain region in the first NchMOSFET.

3. An ESD protection circuit according to claim 1, wherein the first NchMOSFET includes an impurity diffusion layer of n-type between an area immediately beneath the first area of the surface and the source region and another impurity diffusion layer of an n-type between an area immediately beneath the first area of the surface and the drain region, and the electric resistance of an area between the first area of the surface and the surface of the source region is equal to the electric resistance of an area between the first area of the surface and the surface of the drain region in the first NchMOSFET.

4. An ESD protection circuit according to claim 1, further comprising:

a power source terminal for supplying a source voltage;

a first PchMOSFET having a drain connected to the I/O pad and a source and a gate both connected to the power source terminal, and a second PchMOSFET having a drain connected to the I/O pad and a source and a gate both connected to the power source terminal, wherein the first PchMOSFET and the second PchMOSFET each include:

a semiconductor layer of an n-type having a surface having a third area and a fourth area which is offset from the third area;

a gate insulator layer located on the third area of the surface of the semiconductor layer;

a gate electrode located on the gate insulator layer; and a source region of n-type and a drain region of n-type each located in the semiconductor layer below the fourth area of the surface, wherein the electric resistance of an area between the third area of the surface and the surface of the source region is equal to the electric resistance of an area between the third area of the surface and the surface of the drain region.

5. An ESD protection circuit according to claim 4, wherein the second NchMOSFET and the second PchMOSFET are connected to an output control circuit for outputting an electric signal to the I/O pad.

* * * * *